United States Patent
Ohbuchi

(10) Patent No.: US 6,711,196 B2
(45) Date of Patent: Mar. 23, 2004

(54) STRIPE WAVEGUIDE STRUCTURE TYPE SEMICONDUCTOR LASER DEVICE AND FABRICATING METHOD THEREFOR

(75) Inventor: Syuzo Ohbuchi, Yamatokooriyama (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/348,323

(22) Filed: Jan. 22, 2003

(65) Prior Publication Data

US 2003/0152122 A1 Aug. 14, 2003

(30) Foreign Application Priority Data

Jan. 22, 2002 (JP) ........................ 2002-013021

(51) Int. Cl.⁷ .................................. H01S 5/00
(52) U.S. Cl. .......................... 372/45; 372/46
(58) Field of Search ....................... 372/43–50

(56) References Cited

U.S. PATENT DOCUMENTS 5,042,045 A * 8/1991 Sato ........................ 372/46
5,757,835 A * 5/1998 Ono et al. ................. 372/46

FOREIGN PATENT DOCUMENTS

| JP | 06112592 A | * 4/1994 | .......... H01S/3/18 |
| JP | 07007219 A | * 1/1995 | .......... H01S/3/18 |
| JP | 08-250801 | 9/1996 | |
| JP | 11-017269 | 1/1999 | |
| JP | 11-135884 | 5/1999 | |
| JP | 2001-203424 | 7/2001 | |

* cited by examiner

Primary Examiner—Quyen Leung
(74) Attorney, Agent, or Firm—Morrison & Foerster LLP

(57) ABSTRACT

There is provided a stripe waveguide structure type semiconductor laser device capable of preventing the occurrence of unevenness on the side surface of a channel and a fabricating method therefor. An etching stop layer 1 is formed under a second upper clad layer 2. This etching stop layer 1 is constructed of a GaAs layer 1a, an $Al_{0.5}Ga_{0.5}As$ layer 1b formed under this GaAs layer 1a and a GaAs layer 1c formed under this $Al_{0.5}Ga_{0.5}As$ layer 1b. With this arrangement, the unevenness of the side surface of the channel formed of a GaAs layer 3 and the second upper clad layer 2 can be controlled.

8 Claims, 3 Drawing Sheets

STRIPE WAVEGUIDE STRUCTURE TYPE SEMICONDUCTOR LASER DEVICE AND FABRICATING METHOD THEREFOR

BACKGROUND OF THE INVENTION

The present invention relates to a stripe waveguide structure type semiconductor laser device needed for optical information processing of, for example, optical fiber communications, optical measurement systems, and optical disks and a fabricating method therefor, and relates, in particular, to a fabricating method of the channel structure of a semiconductor laser device.

In this specification, the term of "channel" means a path through which an electric current flows.

Conventionally, there has been a semiconductor laser that has a structure for current constriction and optical confinement on a substrate. There is a ridge structure as one of the above-mentioned structure, and there is a method for forming this ridge structure by a wet etching method.

One example of the wet etching will be described below.

First of all, as shown in FIG. 3A, for example, a GaAs layer 33 and a GaAlAs layer 32 are etched by means of a resist mask 34. Subsequently, as shown in FIG. 3B, the GaAlAs layer 32 is selectively etched to form a GaAlAs layer 132 under the GaAs layer 33. At this time, etching depth is accurately controlled by an etching stop layer 31 under the GaAlAs layer 132.

However, according to the aforementioned wet etching method, the etched side surface cannot be prevented from having unevenness because of isotropic etching property of the wet etching method. That is, the side surface of the channel constructed of the GaAs layer 33 and the GaAlAs layer 132 comes to have unevenness. Consequently, there is a problem that, if a layer that becomes a current block layer is grown again on both sides of the channel, a recess portion on the side surface of the channel is left as a hole and crystallinity becomes significantly degraded.

If there is a cavity portion as a hole portion inside the crystals of a semiconductor laser, the subsequent processes might be limited, and complicated processes might result.

Moreover, if the crystallinity of the semiconductor laser is degraded, then adverse influence on the laser operating life and variations in characteristics result, exerting adverse influence on the yield and quality of production.

SUMMARY OF THE INVENTION

Accordingly, the object of the present invention is to provide a stripe waveguide structure type semiconductor laser device capable of preventing the occurrence of unevenness on the side surface of the channel and a fabricating method therefor.

In order to achieve the above object, there is provided a stripe waveguide structure type semiconductor laser device in which a $Ga_{1-x}Al_xAs$ ($0 \leq x \leq 0.5$) active layer, a first upper clad layer, an etching stop layer, a stripe-shaped second upper clad layer and a protective layer are successively laminated on a lower clad layer, the second upper clad layer having different compositions in its upper portion and its lower portion, and the etching stop layer being comprised of three different layers.

According to the stripe waveguide structure type semiconductor laser device of the above-mentioned construction, when the protective layer is formed of, for example, the GaAs layer and the second upper clad layer is formed of, for example, the AlGaAs layer, a channel is formed of a layer structure of GaAs and AlGaAs. In this case, the etching stop layer is constructed of three different layers. Therefore, etching can be performed by means of an etchant that can etch both GaAs and AlGaAs, an etchant that can selectively etch AlGaAs, an etchant that can selectively etch GaAs and an etchant that can selectively etch AlGaAs. Therefore, the unevenness of the side surface of the channel can be controlled, so that the unevenness can be prevented from occurring on the side surface of the channel. That is, an ideal channel configuration can be obtained.

Moreover, since the occurrence of the unevenness can be prevented on the side surface of the channel, even if crystals are grown on the side surface of the channel, it is enabled to prevent a hole from being left as a cavity. If a plane direction that exerts adverse influence on the laser characteristics and on operating life is known, then the plane direction can be made suppressed from appearing by adjusting the layer structure and the etching conditions.

In one embodiment of the present invention, the protective layer is comprised of a GaAs layer, and the second upper clad layer is comprised of an AlGaAs layer, and the etching stop layer is comprised of three layers of a GaAs layer, a $Ga_{1-y}Al_yAs$ ($0.4 \leq y \leq 0.8$) layer and a GaAs layer.

In one embodiment of the present invention, the second upper clad layer has a GaAlAs multilayer structure whose Al crystal mixture ratio becomes higher in steps from the protective layer side toward the etching stop layer side.

In one embodiment of the present invention, the second upper clad layer has GaAlAs whose Al crystal mixture ratio becomes continuously higher from the protective layer side toward the etching stop layer side.

In one embodiment of the present invention, the second upper clad layer has a stripe waveguide structure formed in a forward mesa direction.

Also, there is provided a method for fabricating the stripe waveguide structure type semiconductor laser device, comprising:

a first step for etching the second upper clad layer and the protective layer by means of a first etchant that can etch both the second upper clad layer and the protective layer;

a second step for etching the second upper clad layer by means of a second etchant that possesses a great etching rate of the second upper clad layer and an impotent etching capability or a small etching rate of the protective layer and an uppermost layer of the etching stop layer;

a third step for etching the protective layer and the uppermost layer of the etching stop layer by means of a third etchant that possesses a great etching rate of the protective layer and the uppermost layer of the etching stop layer and an impotent etching capability or a small etching rate of the second upper clad layer and a central layer of the etching stop layer; and a fourth step for etching the second upper clad layer and the central layer of the etching stop layer by means of a fourth etchant that possesses a great etching rate of the second upper clad layer and the central layer of the etching stop layer and an impotent etching capability or a small etching rate of the protective layer and a lowermost layer of the etching stop layer.

In one embodiment of the present invention, the first etchant is comprised of sulfuric acid, a hydrogen peroxide solution and water, the second etchant is comprised of hydrofluoric solution and water, the third etchant is comprised of ammonia, a hydrogen peroxide solution and water, and the fourth etchant is comprised of hydrofluoric solution and water.

In one embodiment of the present invention, an etching rate achieved by the first through fourth etchants is 10 Å/second to 500 Å/second.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS (First Embodiment)

FIGS. 1A through 1D are schematic process charts of the fabricating method of the stripe waveguide structure type semiconductor laser device according to the first embodiment of the present invention.

Figure 1A:
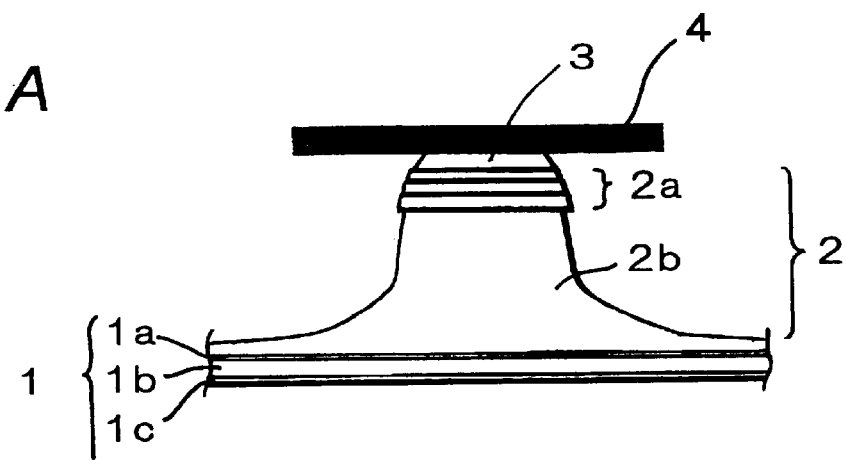
FIGS. 1A through 1D are schematic process charts of a fabricating method of a stripe waveguide structure type semiconductor laser device according to a first embodiment of the present invention.

According to the fabricating method of the above-mentioned stripe waveguide structure type semiconductor laser device, a ridge structure that serves as a channel structure is fabricated in a wafer shown in FIG. 1A. This wafer has a GaAs layer 3, which has a film thickness of, for example, 0.2 μm for forming a protective layer, as an uppermost surface layer. A second upper clad layer 2 is provided under the GaAs layer 3. This second upper clad layer 2 has a three-layer structure 2a as a GaAlAs multilayer structure, which has a film thickness of, for example, 0.2 μm and of which the Al composition increases in steps of 20%, 30% and 40% from the upper side to the lower side in the figure and an $Al_{0.5}Ga_{0.5}As$ layer 2b, which has a film thickness of, for example, 1.3 μm and is provided under this three-layer structure 2a. An etching stop layer 1 is provided under the second upper clad layer 2. This etching stop layer 1 is constructed of a GaAs layer 1a, which has a film thickness of, for example, 30 Å, an $Al_{0.5}Ga_{0.5}As$ layer 1b, which has a film thickness of, for example, 0.1 μm and the same crystal mixture ratio as that of the $Al_{0.5}Ga_{0.5}As$ layer 2b and is formed under this GaAs layer 1a, and a GaAs layer 1c, which has a film thickness of, for example, 30 Å and is formed under this $Al_{0.5}Ga_{0.5}As$ layer 1b.

Although not shown, a first upper clad layer, a $Ga_{1-x}Al_xAs$ ($0 \leq x \leq 0.5$) active layer and a lower clad layer are provided under the etching stop layer 1. This $Ga_{1-x}Al_xAs$ active layer is held between the first upper clad layer and the lower clad layer. Then, the bandgaps of the lower clad layer and the first upper clad layer are each made greater than the bandgap of the $Ga_{1-x}Al_xAs$ active layer.

The fabricating method of the above-mentioned semiconductor laser device will be described below with reference to FIGS. 1A through 1D.

First of all, as shown in FIG. 1A, a resist mask 4 of a prescribed configuration is formed on the GaAs layer 3 and subjected to etching for, for example, 180 seconds by means of a first etchant. As one example of the first etchant, there is a sulfuric acid based etchant having a mixture ratio of $H_2SO_4:H_2O_2:H_2O=1:10:50$. The liquid temperature of the first etchant is set at, for example, 10° C. When the above-mentioned etching is performed, by setting a ridge direction (direction perpendicular to the sheet plane) in the forward mesa direction of the wafer, then the unevenness of the side surface can be reduced because of the easily etchable plane direction of the GaAs portion.

Figure 1B:
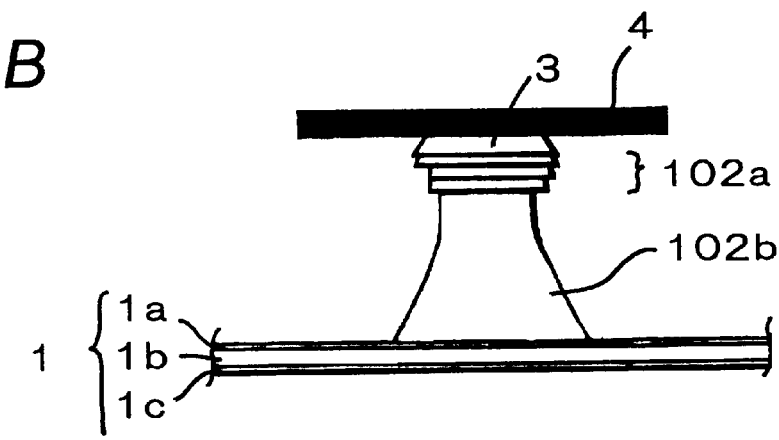

Next, when etching Ls performed for, for example, 50 seconds by means of HF as one example of a second etchant, then a three-layer structure 102a and an $Al_{0.5}Ga_{0.5}As$ layer 102b shown in FIG. 1B are formed on the etching stop layer 1. At this time, the liquid temperature of HF is set at, for example, 10° C.

Figure 1C:
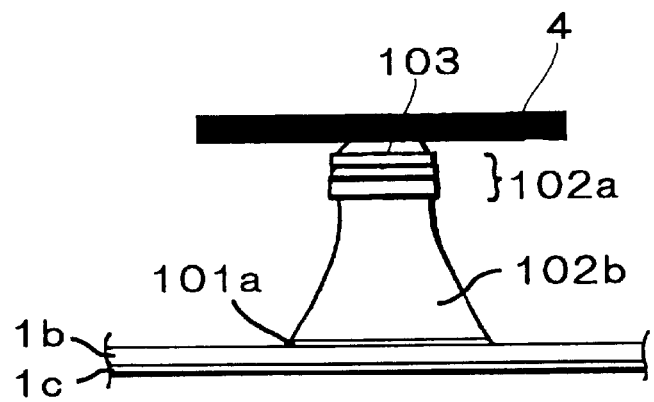

Next, when etching is performed for, for example, 30 seconds by means of a third etchant having a liquid temperature of, for example, 10° C., then the GaAs layer 1a on both sides of the ridge structure is removed, and a GaAs layer 103 shown in FIG. 1C is formed on the three-layer structure 102a. At this time, a GaAs layer 101a is formed under the $Al_{0.5}Ga_{0.5}As$ layer 102b. Moreover, as one example of the third etchant, there is an ammonia based etchant having a mixture ratio of $NH_4OH:H_2O_2:H_2O=1:30:50$. In this etchant, regarding the mixture ratio of ammonia water and a hydrogen peroxide solution, by mixing ten or more parts of hydrogen peroxide solution with respect to one part of ammonia water, the selective etching of GaAs can be achieved.

Figure 1D:
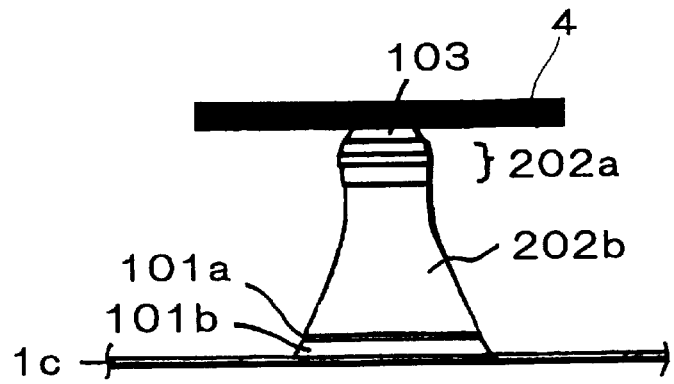

When etching is performed for, for example, 15 seconds by means of HF as one example of a fourth etchant, then the $Al_{0.5}Ga_{0.5}As$ layer 1b on both sides of the ridge structure is removed, and as shown in FIG. 1D, a ridge constructed of the GaAs layer 103, a three-layer structure 202a and an $Al_{0.5}Ga_{0.5}As$ layer 202b can be obtained. At this time, an $Al_{0.5}Ga_{0.5}As$ layer 101b is formed under the GaAs layer 101a.

As described above, by means of the etchant of small selectivity achieved by the composition ratio, the etchant for selectively etching the layers of GaAs to the low Al crystal mixture ratio and the etchant for selectively etching the crystals of an Al ratio higher than that of $Al_{0.4}Ga_{0.6}As$, the uneven configuration of the ridge side surface can be controlled. Therefore, the occurrence of unevenness on this ridge side surface can be prevented.

In the aforementioned first embodiment, no description has been provided for the materials of the lower clad layer and the first upper clad layer. However, it is acceptable to form the lower clad layer and the first upper clad layer of, for example, $Al_{0.5}Ga_{0.5}As$.

Moreover, the layer formed between the GaAs layer 1a and the GaAs layer 1c may have an Al composition ratio of not smaller than 0.4.

It is preferable to set the etching rate achieved by each etchant at 10 Å/second to 500 Å/second. This is because the etching time becomes too long when the etching rate is smaller than 10 Å/second, and therefore, the productivity becomes degraded. Moreover, when the etching rate exceeds 500 Å/second, there result controllability and reproducibility of large variations, and it becomes difficult to obtain the reproducibility of the desired configuration.

When the film thickness of the resist mask 4 is set at 6 μm and the etching is performed on the conditions of the present embodiment, then a ridge configuration having a ridge bottom width of 2.5 µm and a GaAs upper portion width of 0.5 µm to 1.0 µm can be formed.

(Second Embodiment)

FIGS. 2A through 2D are schematic process charts of the fabricating method of the stripe waveguide structure type semiconductor laser device according to the second embodiment of the present invention. In FIGS. 2A through 2D, the same components as the components shown in FIGS. 1A through 1D are denoted by the same reference numerals as the components shown in FIGS. 1A through 1D, and no or simple description is provided for the components.

Figure 2A:
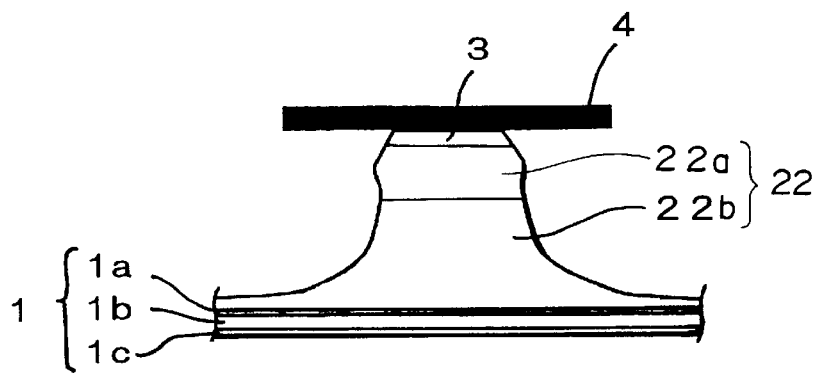
FIGS. 2A through 2D are schematic process charts of a fabricating method of a stripe waveguide structure type semiconductor laser device according to a second embodiment of the present invention.

According to the fabricating method of the aforementioned stripe waveguide structure type semiconductor laser device, a ridge structure that serves as a channel is fabricated in a wafer shown in FIG. 2A. This wafer has a GaAs layer 3, which has a film thickness of, for example, 0.2 µm for forming a protective layer, as an uppermost surface layer. A second upper clad layer 22 is formed under a GaAs layer 3. This second upper clad layer 22 is constructed of a first region 22a that ranges from the GaAs layer 3 to a depth of 0.6 µm and a 1.3-µm deep second region 22b that ranges from this first region 22a to the GaAs layer 1a of the etching stop layer 1. The first region 22a has an Al composition ratio continuously increasing from the upper side to the lower side in the figure. On the other hand, the second region 22b is constructed of $Al_{0.5}Ga_{0.5}As$ and has a uniform Al crystal mixture ratio.

Figure 2B:
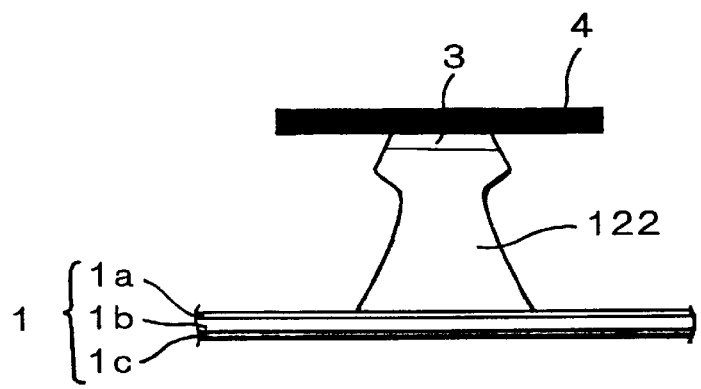
Figure 2C:
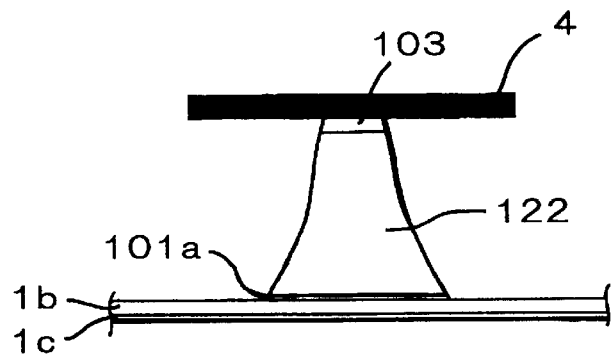
Figure 2D:
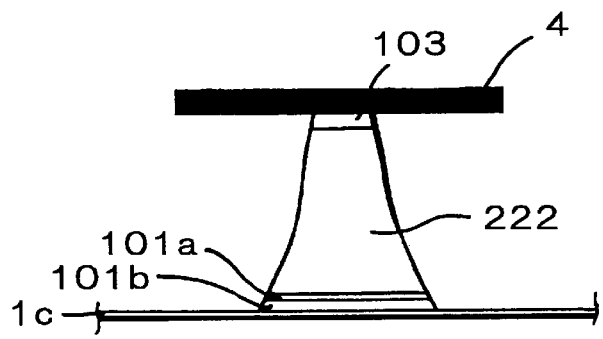
Figure 3A:
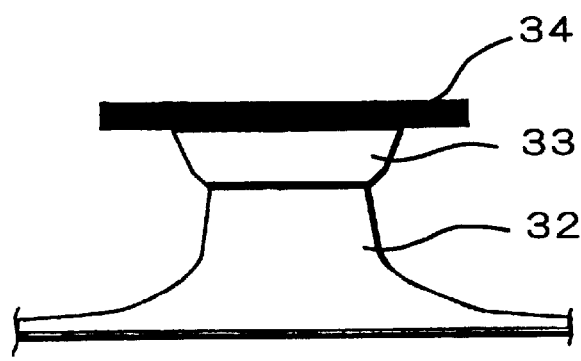
FIGS. 3A and 3B are schematic process charts of a fabricating method of a conventional stripe waveguide structure type semiconductor laser device.
Figure 3B:
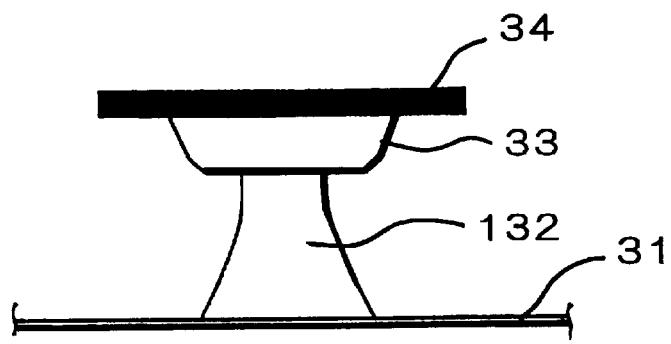

When the above-mentioned wafer is etched on the same conditions as those of the first embodiment, then the second upper clad layer 22 shown in FIG. 2A changes to a second upper clad layer 122 as shown in FIGS. 2B and 2C and thereafter changes to a second upper clad layer 222 as shown in FIG. 2D. At this time, the GaAs layer 3 shown in FIGS. 2A and 2B changes to a GaAs layer 103 as shown in FIGS. 2C and 2D. A ridge constructed of this GaAs layer 103 and the second upper clad layer 222 has a side surface smoother than the side surface of the ridge of the first embodiment. That is, the ridge having a side surface smoother than the side surface of the ridge of the first embodiment can be formed.

The stripe waveguide structure, i.e., the ridge structure formed in the first and second embodiments may be formed by implantation and growth.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A stripe waveguide structure type semiconductor laser device in which a $Ga_{1-x}Al_xAs$ ($0 \leq x \leq 0.5$) active layer, a first upper clad layer, an etching stop layer, a stripe-shaped second upper clad layer and a protective layer are successively laminated on a lower clad layer, the second upper clad layer having different compositions in its upper portion and its lower portion, and the etching stop layer being comprised of three different layers.

2. The stripe waveguide structure type semiconductor laser device as claimed in claim 1, wherein the protective layer is comprised of a GaAs layer, and the second upper clad layer is comprised of an AlGaAs layer, and the etching stop layer is comprised of three layers of a GaAs layer, a $Ga_{1-y}Al_yAs$ ($0.4 \leq y \leq 0.8$) layer and a GaAs layer.

3. The stripe waveguide structure type semiconductor laser device as claimed in claim 1, wherein the second upper clad layer has a GaAlAs multilayer structure whose Al crystal mixture ratio becomes higher in steps from the protective layer side toward the etching stop layer side.

4. The stripe waveguide structure type semiconductor laser device as claimed in claim 1, wherein the second upper clad layer has GaAlAs whose Al crystal mixture ratio becomes continuously higher from the protective layer side toward the etching stop layer side.

5. The stripe waveguide structure type semiconductor laser device as claimed in claim 1, wherein the second upper clad layer has a stripe waveguide structure formed in a forward mesa direction.

6. A method for fabricating the stripe waveguide structure type semiconductor laser device as claimed in claim 1, comprising:

a first step for etching the second upper clad layer and the protective layer by means of a first etchant that can etch both the second upper clad layer and the protective layer;

a second step for etching the second upper clad layer by means of a second etchant that possesses a great etching rate of the second upper clad layer and an impotent etching capability or a small etching rate of the protective layer and an uppermost layer of the etching stop layer;

a third step for etching the protective layer and the uppermost layer of the etching stop layer by means of a third etchant that possesses a great etching rate of the protective layer and the uppermost layer of the etching stop layer and an impotent etching capability or a small etching rate of the second upper clad layer and a central layer of the etching stop layer; and a fourth step for etching the second upper clad layer and the central layer of the etching stop layer by means of a fourth etchant that possesses a great etching rate of the second upper clad layer and the central layer of the etching stop layer and an impotent etching capability or a small etching rate of the protective layer and a lowermost layer of the etching stop layer.

7. The stripe waveguide structure type semiconductor laser device fabricating method as claimed in claim 6, wherein the first etchant is comprised of sulfuric acid, a hydrogen peroxide solution and water, the second etchant is comprised of hydrofluoric solution and water, the third etchant is comprised of ammonia, a hydrogen peroxide solution and water, and the fourth etchant is comprised of hydrofluoric solution and water.

8. The stripe waveguide structure type semiconductor laser device fabricating method as claimed in claim 6, wherein an etching rate achieved by the first through fourth etchants is 10 Å/second to 500 Å/second.

* * * * *